(12) United States Patent
Bauer et al.

(10) Patent No.: US 8,283,762 B2
(45) Date of Patent: Oct. 9, 2012

(54) LEAD FRAME BASED SEMICONDUCTOR PACKAGE AND A METHOD OF MANUFACTURING THE SAME

(75) Inventors: Robert Bauer, Ismaning (DE); Anton Kolbeck, Röhrmoos (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/182,137

(22) Filed: Jul. 13, 2011

(65) Prior Publication Data

US 2011/0266663 A1 Nov. 3, 2011

Related U.S. Application Data

(62) Division of application No. 12/158,393, filed as application No. PCT/EP2005/057026 on Dec. 21, 2005, now Pat. No. 8,004,069.

(30) Foreign Application Priority Data

Dec. 21, 2005 (EP) .................. PCT/EP2005/057026

(51) Int. Cl.
*H01L 23/495* (2006.01)

(52) U.S. Cl. ................ 257/676; 257/666; 257/E23.141; 257/670; 257/E21.502; 257/E21.509

(58) Field of Classification Search .................. 257/666, 257/676, E23.141, 670, E21.502, E21.51, 257/E21.509, E23.033
See application file for complete search history.

(56) References Cited

U.S. PATENT DOCUMENTS

| | | | |
|---|---|---|---|
| 4,918,511 A | 4/1990 | Brown | |
| 4,924,351 A | 5/1990 | Kato et al. | |
| 5,359,223 A | 10/1994 | Nakamori | |
| 5,430,331 A | 7/1995 | Hamzehdoost et al. | |
| 6,501,160 B1 | 12/2002 | Higuchi et al. | |
| 6,777,788 B1 | 8/2004 | Wan et al. | |
| 6,821,878 B2 * | 11/2004 | Danvir et al. | 438/613 |
| 6,872,661 B1 | 3/2005 | Kwan et al. | |
| 7,790,500 B2 | 9/2010 | Ramos et al. | |
| 2006/0033236 A1 | 2/2006 | Brandenburg et al. | |
| 2008/0102563 A1 | 5/2008 | Lange et al. | |

FOREIGN PATENT DOCUMENTS

FR 2704114 A 10/1994

OTHER PUBLICATIONS

International Search Report dated Jun. 26, 2007 of PCT Publication No. WO/2007/071285.

* cited by examiner

*Primary Examiner* — Olik Chaudhuri
*Assistant Examiner* — Wilner Jean Baptiste

(57) ABSTRACT

A method of manufacturing a semiconductor package, where the package includes a surface for attachment of the package to a device by a joint formed of a connective material in a joint area of the surface. The method is characterized in that it comprises the step of patterning one or more channels on the surface which channels extend away from the joint area towards an edge of the surface. Also the method has the step of applying a compound to one or more channels which compound interacts with the connective material, such that when the semiconductor package is attached to the device the interaction defines one or more paths in the connective material. These correspond to the one or more channels on the surface and allow the passage of waste material away from the joint area to the outer edge of the surface.

20 Claims, 8 Drawing Sheets

LEAD FRAME BASED SEMICONDUCTOR PACKAGE AND A METHOD OF MANUFACTURING THE SAME

CROSS-REFERENCE TO RELATED APPLICATIONS

This application is a divisional of U.S. patent application Ser. No. 12/158,393, entitled "Improvements in or Relating to Lead Frame Based Semiconductor Package and a Method of Manufacturing the Same," filed on Jun. 20, 2008, which is a National Stage Entry under 37 C.F.R. §371 of PCT/EP2005/057026, filed Dec. 21, 2005, the disclosures of which are hereby expressly incorporated by reference in their entirety.

FIELD OF THE INVENTION

This invention relates to lead frame based semiconductor packages and a method of manufacturing the same, in particular the invention relates to a lead frame based overmolded semiconductor package with patterning on the exposed pad and a method of manufacturing the same, to improve the attachment of semiconductor packages to printed circuit boards, substrates or any other circuit or semiconductor element.

BACKGROUND OF THE INVENTION

Semiconductor packages with an exposed pad or other surfaces for attachment tend to sustain heavy solder voiding levels in the exposed package area during PCB attachment. Such voiding on the pad solder joint can have adverse effects on the thermal performance of the package. In addition, changes to the electrical and thermal path within the completed solder contact can impact certain other applications as well. In certain circumstances, depending on the location of the solder voids, this can result in the completed assembly achieving below desired board performance levels. An example of such a circumstance is when large voids occur directly underneath the position of a semiconductor die. FIG. 1 shows an example of a package assembly indicating 5 areas 100, 102, 104, 106, 108 where there are solder voids which may impact the performance of the package in some respect or another.

There have been a number of proposals of methods to attempt to combat this problem. A commonly accepted industrial practice to overcome these problems has involved putting patterns in a solder paste deposit or patterns of the die attached flag inside the package. U.S. Pat. No. 6,872,661 B1 (leadless plastic chip carrier with etch back pad singulation and a die attached pad array) describes a package which is built from a plurality of single die attached pads and contact pads which attempts to solve some of the problems identified above. However the patent does not resolve these problems for the following reasons:

A die to be mounted is mounted on a plurality of die attached pads which are completely separate from one another. This would provide a relatively low thermal mass in the die attach area.

The described method uses an epoxy material in the die attached process which would not allow this method to be used in power applications.

The patent also discloses a complicated set of steps, including several etch back steps after molding which require special processes during production. This is generally not very efficient or desirable.

SUMMARY OF THE INVENTION

The present invention provides a method of manufacturing a semiconductor package and such a package as described in the accompanying claims.

BRIEF DESCRIPTION OF THE DRAWINGS

Reference will now be made, by way of example, to the accompanying drawings, in which.

DETAILED DESCRIPTION OF THE PREFERRED EMBODIMENTS

Figure 1:
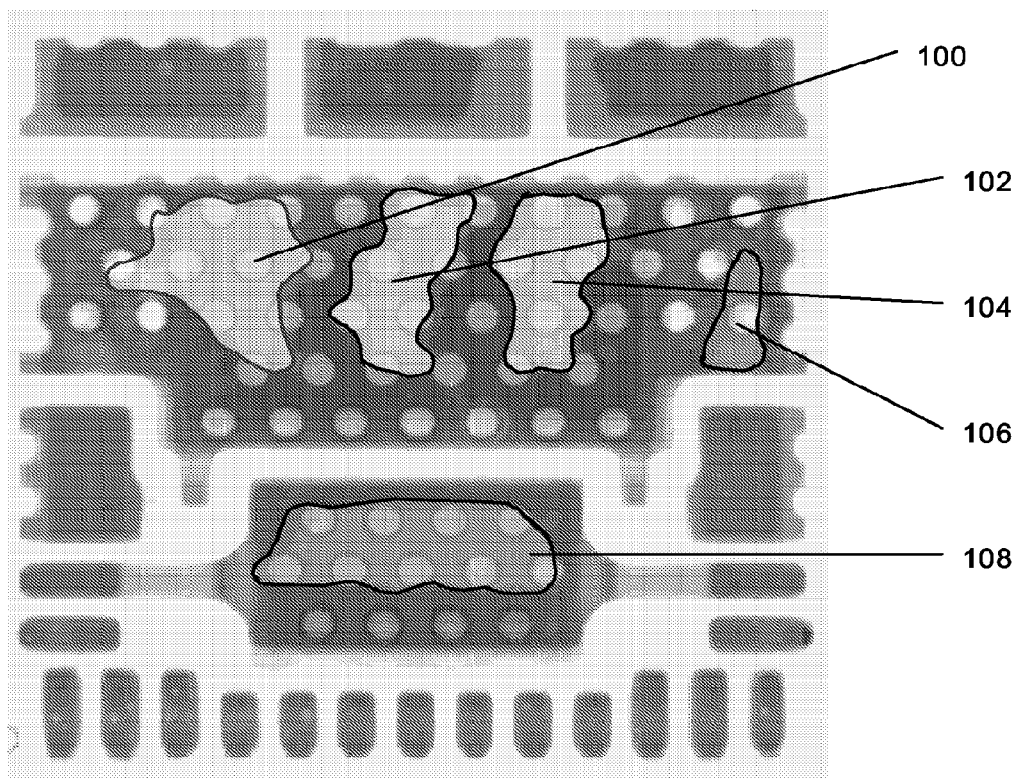
FIG. 1 is a prior art diagram showing the nature of the problem solved by the present invention.
Figure 2:
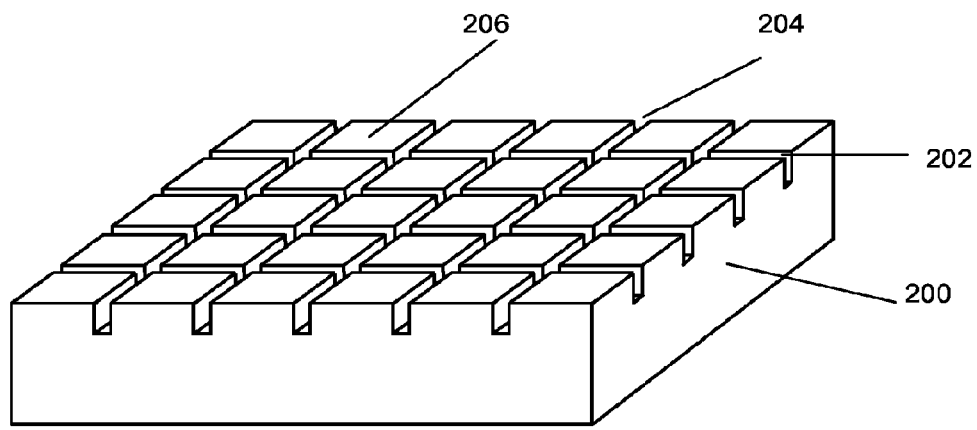
FIG. 2 is a diagram of the body structure of an exposed pad in accordance with one embodiment of the invention, given by way of example.

FIG. 2 shows the outside surface of a die flag of a lead frame 200. The lead frame is basically the substrate or "back bone" carrier of a package. The lead frame is typically metallic and conductive, although not always so. The lead frame includes a die flag which carries semiconductor chips. The surface of the package according to an embodiment of the present invention includes a pattern of rows 202 and columns 204 of channels or trenches on the surface. The rows and columns form a regular grid pattern. FIG. 2 shows four rows and five columns and the grid pattern defines thereby a plurality of squares or pedestals 206. FIG. 2 shows one particular orientation of grid that may be patterned onto the surface of the package. It would be clear however that other patterns are equally applicable. For example, other grid orientations, curves, spirals or whatever, as long as the channels lead towards the edge of the package or away from any area which will form a potential joint in the future.

The cross hatch trench pattern or grid of channels on the exposed pad of the outside of the lead frame can be made in a number of different ways. This includes hatching, milling, punching or other appropriate machining procedures during the manufacturing process of the lead frame itself. The way in which the grid of channels is produced could be of any appropriate type for all the various embodiments of the present invention described herein.

The function of the channels forming the grid i.e. the rows and columns will be described in greater detail below, as will the need for them to extend away from the joint area.

Figure 3:
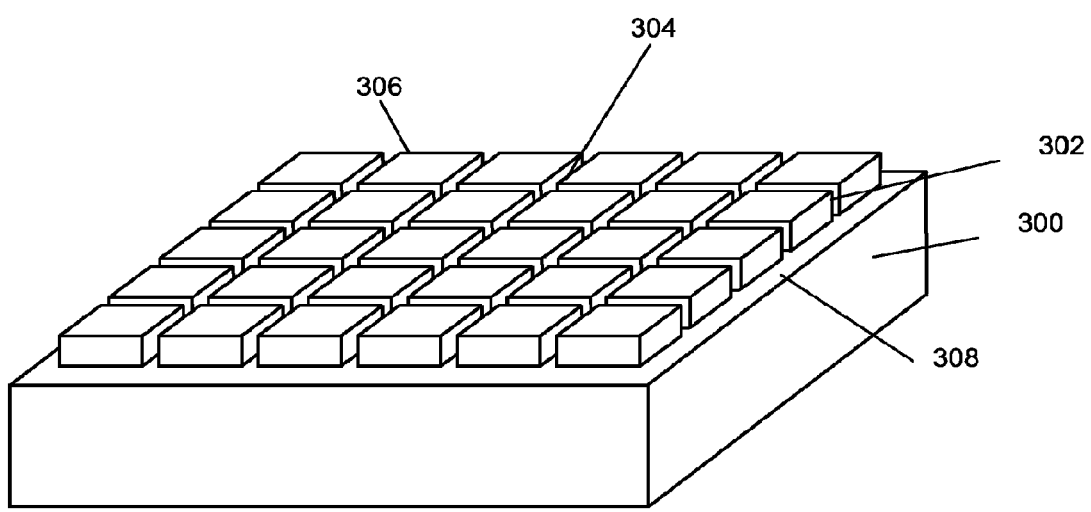
FIG. 3 is a diagram of the body structure of an exposed pad in accordance with another embodiment of the invention, given by way of example.

Referring to FIG. 3 a second embodiment of the package is shown. Lead frame 300 includes rows 302 and columns 304 of channels which define a grid having a number of pedestals 306. This embodiment is essentially similar to that shown in FIG. 2. However, the embodiment of FIG. 3 shows also a mold lock feature on the pad edge 308. The mold lock feature provides an enhanced mechanical interlocking between the lead frame and a molding compound in the process for manufacturing the package.

Figure 4:
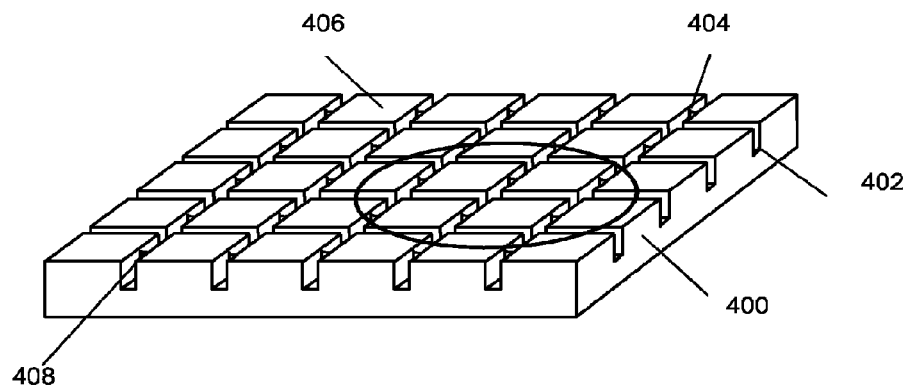
FIG. 4 is a body structure of an exposed pad in accordance with a further embodiment of the invention, given by way of example.
Figure 5:
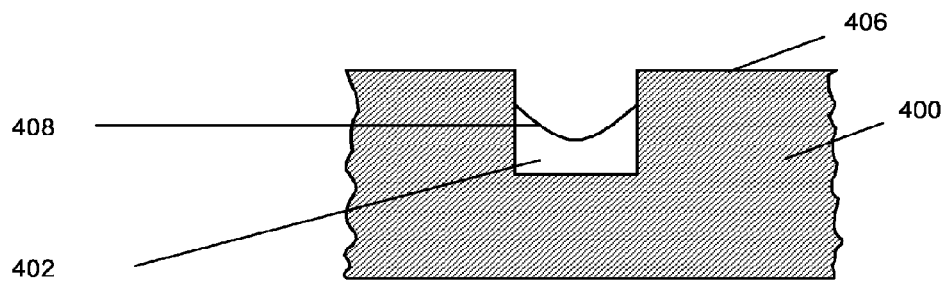
FIG. 5 is a side view of FIG. 4.
Figure 6:
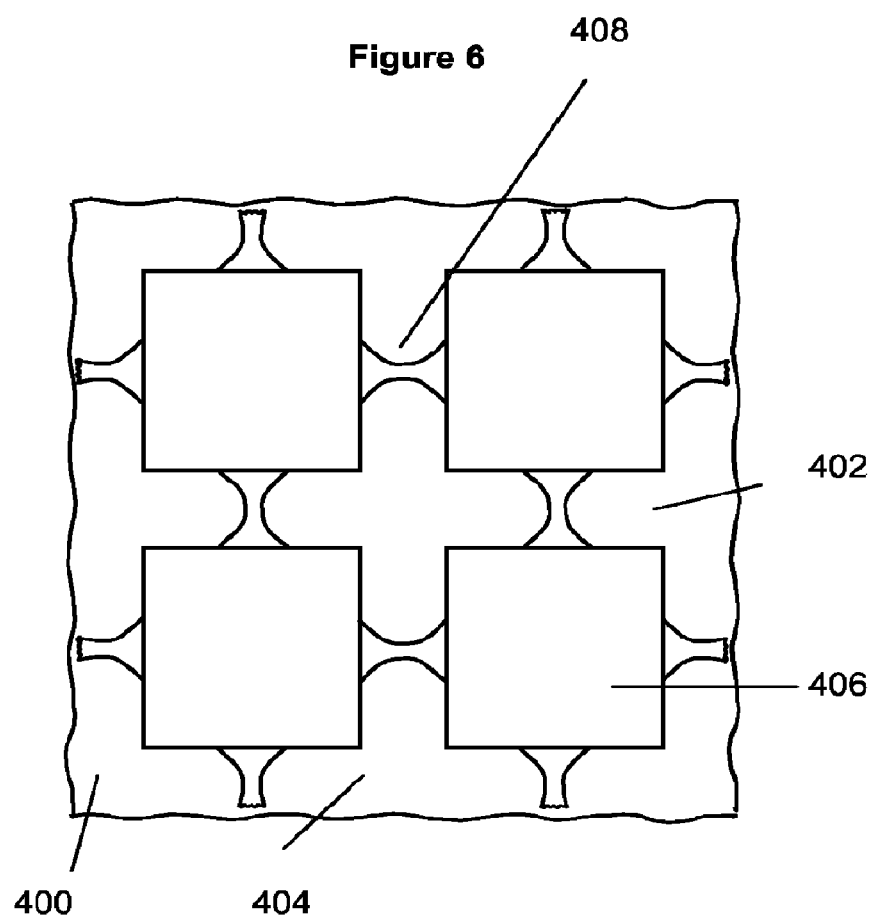
FIG. 6 is a detailed top view of FIG. 4.

In another embodiment of the present invention shown in FIGS. 4, 5 and 6 a grid of channels is shown patterned onto the exposed pad of the body structure of the lead frame but includes in this case a stiffening feature. Referring initially to FIG. 4, the body structure 400 includes rows 402 and columns 404 of channels as in either of FIGS. 2 and 3. Pedestals or squares 406 are defined as previously indicated. In each channel (either rows or columns) there is a stiffening feature 408, this is shown in cross-section in FIG. 5 and from above in FIG. 6. As is shown in FIG. 5, stiffening feature 408 is arcuate in cross sectional view. This means there is less chance of relative movement between the two squares or pedestals 406 of the lead frame package, thereby strengthening the package overall. It will be appreciated that other shapes of stiffening feature will provide the same advantages and this invention is not limited to the stiffener feature being arcuate.

Referring now to FIG. 6 the form of the stiffening feature 408 is shown between respective squares or pedestals 406 and includes a broader section closer to the pedestals and a narrower section in the central part of the channel 404 or 402. This shape is defined herein as bow shaped. The stiffening feature is an integral part of the exposed pad (i.e. it is made from the same piece of material as the other lead frame features) and is manufactured/shaped during the lead frame manufacturing process using the same methods that are used to form the body structure of the exposed pad.

Figure 7:
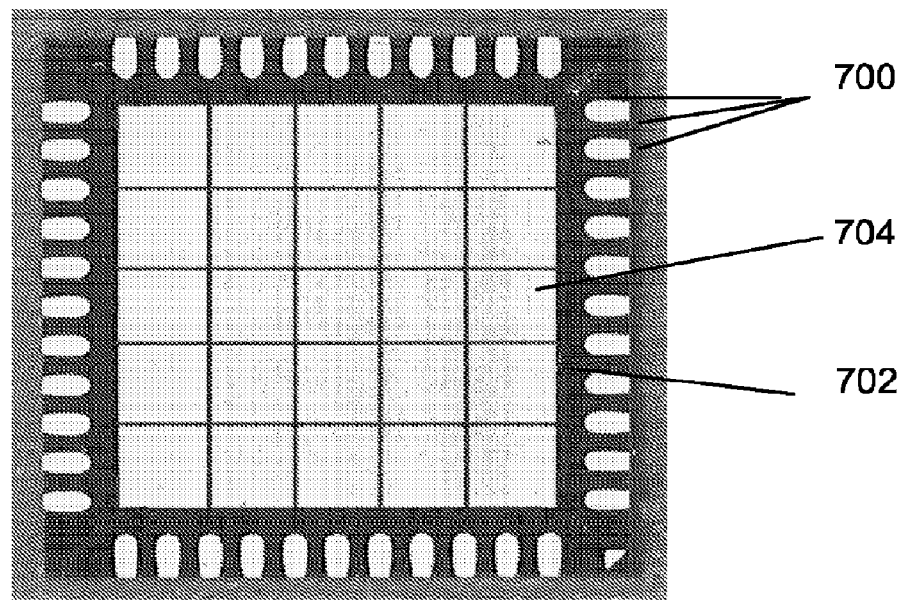
FIG. 7 is a diagram of a package with an exposed pad featuring the cross hatch trench or grid pattern in accordance with an embodiment of the present invention, given by way of example.
Figure 8:
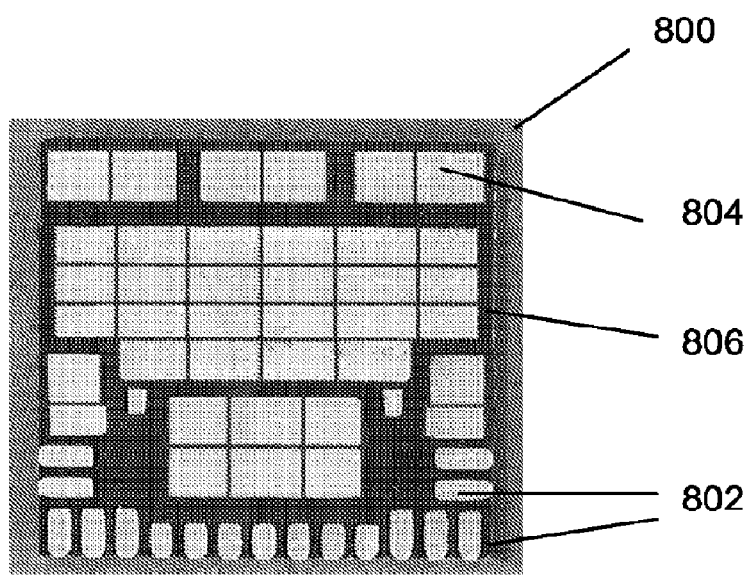
FIG. 8 is a package featuring a cross hatch trench pattern on the exposed pad in accordance of another embodiment of the invention, given by way of example.

Referring now to FIG. 7, a typical package is shown with a plurality of connectors 700 and on the surface of the exposed pad of the lead frame 702 a grid pattern 704 as previously described with respect to other embodiments and drawings. Similarly in FIG. 8 a package 800 is shown having a plurality of connectors 802. The package includes a number of lead frame components or other devices such as an input/output (I/O) 802, 804 etc. Each of the exposed pads 806 of the lead frame or devices include the grid patterning of channels on the surface thereof as previously indicated in other embodiments and drawings. It is preferred that the exposed pad should be patterned only on the outside of the package. This thus provides a full cover pad on the side of the package for die attach as will be described in another part of the specification.

Figure 9:
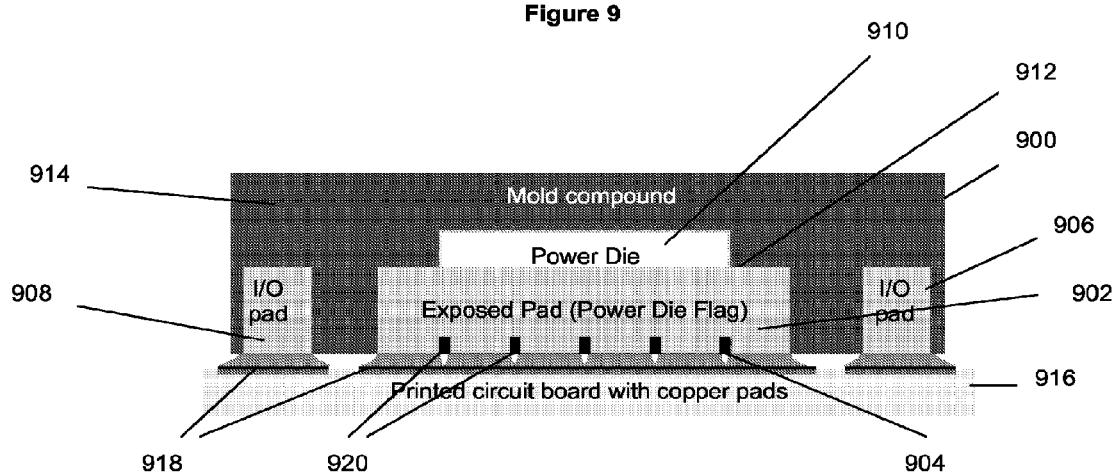
FIG. 9 is a cross section of a package with the pattern exposed pad of FIG. 2 in accordance with an embodiment of the invention, given by way of example.
Figure 10:
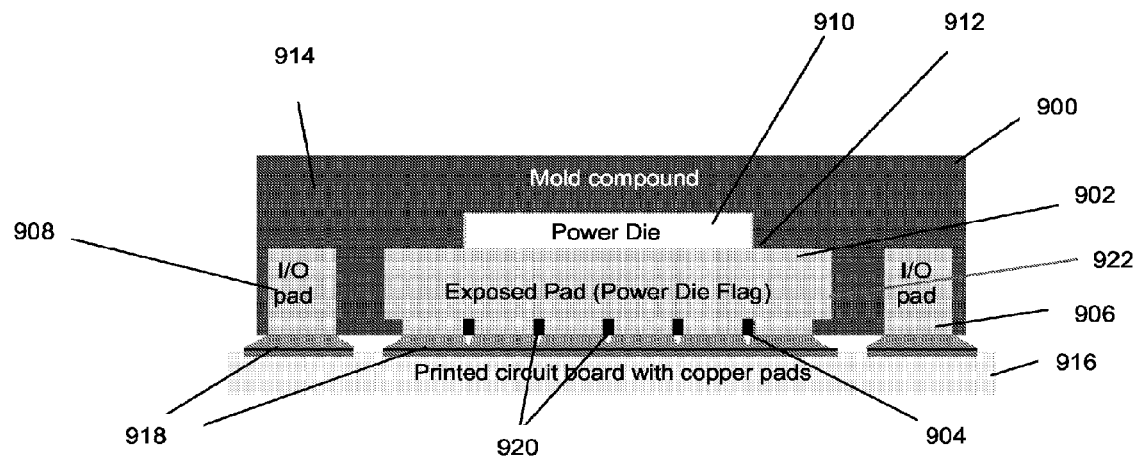
FIG. 10 is a cross section of a package with the cross hatch trench pattern exposed pad as shown in FIG. 3 in accordance with an embodiment of the invention, given by way of example.
Figure 11:
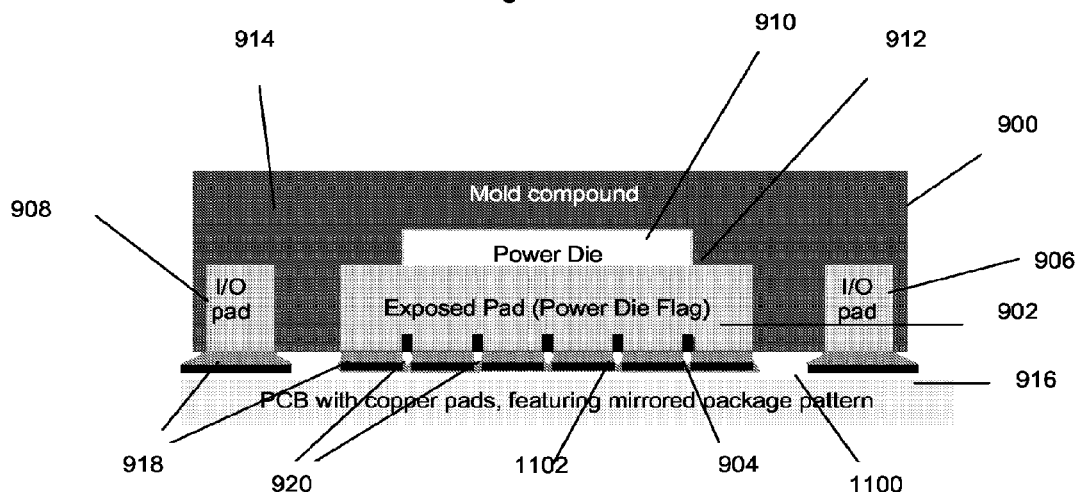
FIG. 11 is a cross section of a package with cross hatch trench pattern exposed pads as shown in FIG. 2, assembled on a printed circuit board with mirrored pattern on the PCB in accordance with an embodiment of the invention, given by way of example.

Referring now to FIGS. 9, 10 and 11 more details of the orientation of the lead frame in the packages and how the channels overcome the problems of the prior art are described.

FIG. 9 shows a package 900 which includes a lead frame having an exposed pad 902 which has channels 904 therein. The channels are formed in rows and columns as previously described but are not shown here as such. The package further includes: multiple input/output (I/O) pads, two of which 906 and 908 are shown, in this example a power die 910; and between the power die and the lead frame a layer of die attach material such as solder, conductive epoxy or any other applicable die attach material 912.

All the above described elements of the package are encased in mold compound 914 which is typically in the form of an epoxy compound. The mold compound enters into the channels 904 during the process of application thereof. The mold compound is indicated as being an epoxy material and of course could be any other appropriate material.

The mold compound encapsulated package may then be soldered onto a printed circuit board (PCB) 916 using a solder joint 918, which may be formed between the PCB and any device thereon. The patterned surface of the lead frame as previously described is a metallic surface whilst the channels are filled with the epoxy mold compound or any other appropriate material. Solder is unable to adhere to such epoxy materials and as a result a channel or path 920 is formed in the solder joint 918 at a position which corresponds to the mold filled channels in the lead frame. These channels 920 allow for continuous out gassing of entrapped air during the reflow process in which the solder is applied. In fact, the air or other waste products from the solder process are moved away from the joint area by means of the channels. This means that there is less likelihood that the solder joint between the PCB and the lead frame is compromised and includes voids.

For the purposes of the material in the channels this may be the mold compound or any other material if the mold compound does not have the right properties for the function required. This function is that to some degree the compound is not wetted by the solder. This may be achieved by selecting the compound to have a lower wettability index with solder than the wettability of the rest of the pad. It is important that the material in the channels is not wetted by the solder in order that channels 920 are produced in the solder.

The terms wetting, wettability and to wet should all be interpreted in the broadest sense and includes bonding strength and adhesion strength. It will be appreciated that the non wetting between the solder and mold compound may be achieved by using various combinations of materials. For example a connecting material other than solder may be used with a compound in the channels which does not show a high level of wettability to that connecting material. Alternatively, the two materials may react chemically to form the channels or paths in the connecting material. Also for certain materials wettability may not be the relevant factor but instead perhaps adhesion ability or bonding strength may be more relevant.

FIG. 9 does not show all the details of connections between various elements of the package, but it will be appreciated the leads, vias, bonds and other connection means can be utilized to effect any electrical connection. Similarly other insulating materials can be used to electrically isolate various components. Also any combination of devices, pads, dies etc can be used as required for the desired package.

One of the advantages of this invention is that it allows the assembly of exposed pad packages or equivalent with a minimum voiding level in the board attached solder joints thereby securing optimized thermal and electrical onboard performance of the package. A relatively high thermal mass is provided using a full pad for die attached at the die side. Because solder may be used the die may be attached as required in power applications.

Another advantage of the present invention is that the board attached solder voiding levels are minimized thereby allowing a greater percentage of the packages to be supplied at the highest level of quality. This would be applicable to all lead frame based over molded semiconductor packages with exposed pads.

Another advantage of the invention includes patterning of the exterior surface of a large lead frame heat sink to minimize the possibility of large voids by reducing the area to wet by solder.

Referring now to FIG. 10 a further embodiment of packages is shown. This package 900 is essentially identical to that in FIG. 9 with the exception that the lead frame as shown in FIG. 3 is utilized in FIG. 10 (whilst that of FIG. 2 is utilized in FIG. 9). The lead frame of FIG. 3 includes the mold lock feature 308. This is shown in FIG. 10 as mold lock area 922. As can be seen this allows mold compound to surround the lead frame and allows enhanced mechanical interlocking between the lead frame and the mold compound. This will generally ensure the package has a longer lifespan.

FIG. 11 shows a further embodiment which is essentially similar to that of FIG. 9 and where common elements are numbered with the same number. The difference in this embodiment is that the contact surface 1100 of the PCB 916 has been patterned with a grid of channels (not shown) and processed in the same manner as the channels on the lead frame, to define augmented channels or paths 1102 in the solder. These channels are augmentations in the illustrated example as they are formed in a corresponding position to those on the lead frame and are substantially aligned therewith. However, it will be appreciated that the position of any channels associated with the PCB may be different from those on the lead frame. The channels on the PCB surface may also be treated prior to the soldering process such that they contain material which is not wetted by the solder thereby accentuating the solder channels 920 and thus thereby ensuring the out-gassing and other advantages of the invention.

Figure 12:
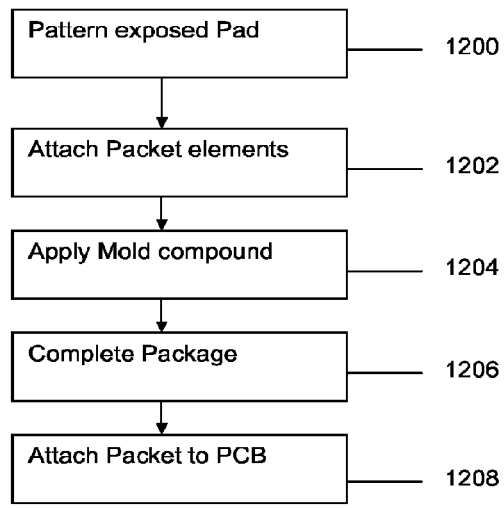
FIG. 12 is a diagram showing the manufacturing process for a typical package in accordance with an embodiment of the present invention, given by way of example.

Referring now to FIG. 12 a flow chart showing the main method steps of the manufacturing process are described.

A pattern of channels is applied to the exposed pad of a lead frame using any appropriate process for the lead frame and pattern that are required. Examples of the processes include, but are not limited to etching the channels, milling the channels, pressing or punching the channels etc (1200).

The various components to be connected to the lead frame may then be attached on the non patterned surface of the lead frame if required. These components will typically be those which form part of a package that is to be mold encapsulated to some degree or another. The exact nature of the components will depend on the device and the ultimate use of the resulting package (1202).

A mold compound is then applied to the various components of the package (1204). This process can be carried out in various different ways including mold pressing or other mold compound application methods. It is important that mold compound settles into the channels on the lead frame to some extent.

The package is then completed as appropriate for the use required. This may include removal of some of the mold compound from certain areas for connections, addition of leads, etc. to be included (1206).

The package is then attached to a PCB or other device using a soldering process (1208). The presence of the mold compound in the channels ensures that adequate egress of air (out-gassing) and other gases or waste material formed during the solder process is achieved due to the presence of the channels and the formation of the paths. This means that the solder will "wet" a greater proportion of the lead frame and/or PCB to thereby minimize the likelihood of voids being formed. The PCB or other device may also be processed to include mold filled channels, as previously described.

For packages with etched lead frames the invention provides an easy method of implementation. This is due to the fact that these lead framed types are manufactured in an etching process and the patterning of channels on the exposed pads can be done in the same process without having additional steps to the overall process.

Figure 13:
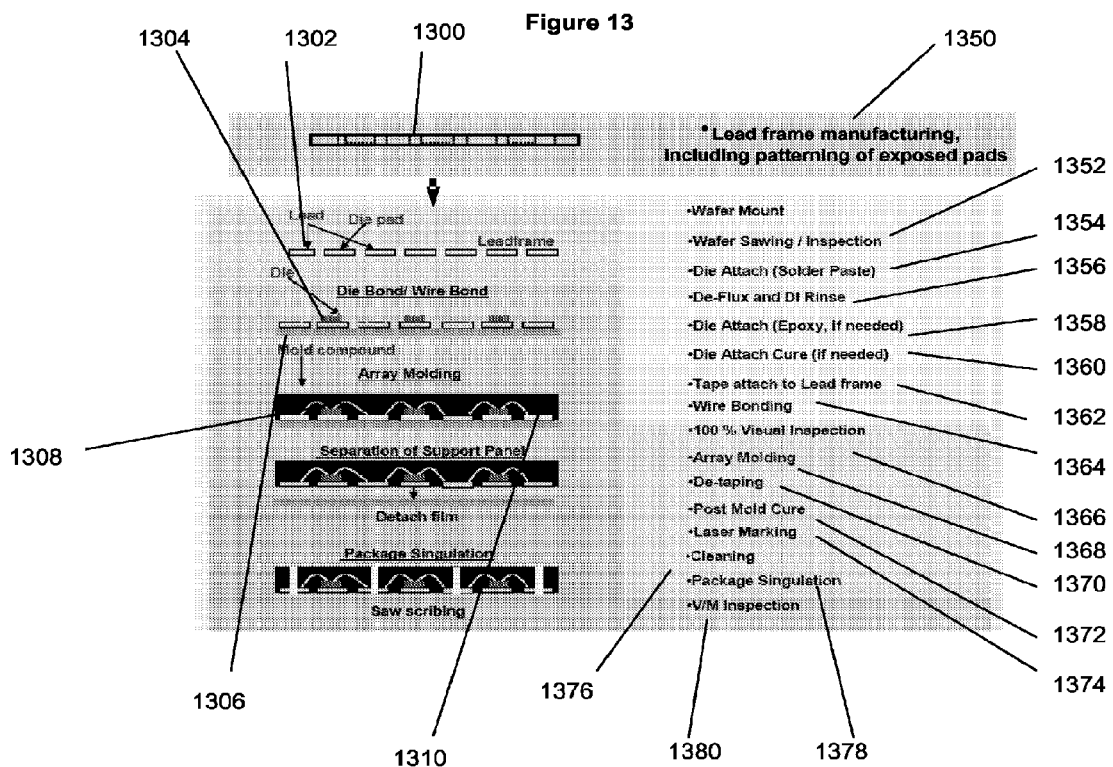
FIG. 13 is a diagram showing various manufacturing process steps which may be used for a typical package in accordance with an embodiment of the present invention, given by way of example.

The manufacturing process of the package may include further steps that are common place in the environment of manufacturing a semiconductor package. FIG. 13 show one example of a set of steps but there are many other variations.

A single lead frame or a set (i.e. matrix) of lead frames 1300/1302 is manufactured and patterned with one or more channels on the exposed pads thereof (1350). One or more different silicon wafers are split into single semiconductor dies by sawing or other appropriate means and are inspected (1352). Die solder paste or any other appropriate die attach material (1304) is applied (1354), the semiconductor die(s) is/are placed into the die attach material, and then cured or reflowed. A de-flux and DI-Water rinse step may then be carried out (1356). If required an epoxy or any other appropriate die attach material is applied (1358), additional semiconductor dies are placed into the die attach material and/or a die attach cure is carried out (1360).

A tape (1306) is attached to the lead frames (1362) and wire bonds (1308) are applied (1364). A visual check is carried out (1366). A molding compound (1310) is applied (1368) and the tape is removed (1370). A post mold cure (1372) and laser marking (1374) steps are followed by a cleaning stage (1376). The package is then split into individual elements (1378) and inspected (1380).

It will be appreciated that the above described invention may include various variations and alternatives which will produce the same advantages as the features herein described, these are hereby included.

What is claimed is:

1. A semiconductor package comprising a surface for attaching the package to a device by a joint formed of a connective material in a joint area of the surface, wherein the package includes:
   one or more channels on the surface which channels extend away from the joint area toward an edge of the surface, the joint to be disposed between the surface and the device;
   a compound in said one or more channels to interact with the connective material, such that when the semiconductor package is attached to the device the interaction has defined one or more paths which correspond to the one or more channels on the surface and which allow the passage of waste material away from the joint area to the outer edge of the surface; and
   wherein the one or more channels include one or more strengthening elements.

2. The semiconductor package of claim 1, wherein the channel has two elongated sides and the one or more strengthening elements are disposed at a point between the two sides to prevent relative movement thereof.

3. The semiconductor package of claim 1, wherein the one or more strengthening elements are substantially arcuate in cross-section and substantially bow shaped in plan view.

4. The semiconductor package of claim 1, wherein the surface is part of a lead frame.

5. The semiconductor package of claim 1, wherein the compound has a wettability less than that of the surface to allow the paths to be formed by the non-wetting of the connective material and the compound.

6. The semiconductor package of claim 1, wherein one or more channels on the surface form a grid of channels having a plurality of pedestals.

7. The semiconductor package of claim 1, wherein the surface and said one or more channels form a pad further comprising a mold lock feature on an edge of said pad.

8. The semiconductor package of claim 1, further comprising:
one or more further channels on a surface of any device;
one or more further paths defined in the connective material, wherein said one or more further paths correspond to the one or more further channels on the surface of the device and which allow the passage of waste material away from the joint; and
said one or more further paths formed by a compound in said one or more further channels on the surface of the device where said compound interacts with the connective material substantially located in each further channel when the device was being attached to the semiconductor package.

9. The semiconductor package of claim 8, further comprising the channels and further channels formed to substantially correspond with one another, such that the path and corresponding further path form an augmented path.

10. The semiconductor package of claim 1, further comprising an encapsulating mold compound.

11. The semiconductor package of claim 1, wherein an encapsulating mold compound encapsulates the semiconductor package and the encapsulating mold compound and the compound applied to the one or more channels are of the same material type.

12. A semiconductor package comprising:
a surface for attachment to a device by a joint formed of a connective material in a joint area of the surface, the joint to be disposed between the surface and the device;
one or more channels on the surface, said one or more channels extending away from the joint area of the surface towards an edge of the surface, each channel having two elongated sides;
a strengthening element within each channel at a point between the two elongated sides;
a compound in said one or more channels to interact with the connective material, such that when the semiconductor package is attached to the device the interaction has defined one or more paths which correspond to the one or more channels on the surface and which allow the passage of waste material away from the joint area to the outer edge of the surface; and
wherein the compound has a wettability less than that of the surface.

13. The semiconductor package of claim 12, wherein the strengthening element is substantially arcuate in cross-section and substantially bow shaped in plan view.

14. The semiconductor package of claim 12, further comprising:
one or more further channels on a surface of any device;
one or more further paths defined in the connective material, wherein said one or more further paths correspond to the one or more further channels on the surface of the device and which allow the passage of waste material away from the joint; and
said one or more further paths formed by a compound in said one or more further channels on the surface of the device where said compound interacts with the connective material substantially located in each further channel when the device was being attached to the semiconductor package.

15. The semiconductor package of claim 12, wherein an encapsulating mold compound encapsulates the semiconductor package and the encapsulating mold compound and the compound in the one or more channels are of the same material type.

16. A semiconductor package comprising:
a surface for attachment of the semiconductor package to a device by a joint formed of a connective material in a heat transfer joint area of the surface;
one or more channels in the heat transfer joint area of the surface, wherein the joint is disposed between the surface and the device, the surface further including a plurality of connector joint areas;
said one or more channels having two elongated sides and said one or more channels including a strengthening element at a point between the two elongated sides wherein the strengthening element is substantially arcuate in cross-section and substantially bow-shaped in plan view;
one or more paths in the connective material which correspond to the one or more channels in the heat transfer joint area of the surface and which allow the passage of waste material away from the heat transfer joint area to the outer edge of the surface; and
said one or more paths formed by a compound applied to said one or more channels, wherein said compound interacts with the connective material substantially located in each channel when the semiconductor package was attached to the device.

17. The semiconductor package of claim 16, wherein the compound has a wettability less than that of the surface to allow the paths to be formed by the non-wetting of the connective material and the compound.

18. The semiconductor package of claim 16, wherein an encapsulating mold compound encapsulates the semiconductor package and the encapsulating mold compound and the compound in the one or more channels are of the same material type.

19. The semiconductor package of claim 16, further comprising:
one or more further channels on a surface of any device;
one or more further paths defined in the connective material, wherein said one or more further paths correspond to the one or more further channels on the surface of the device and which allow the passage of material away from the joint; and
said one or more further paths formed by a compound in said one or more further channels on the surface of the device and which interacts with the connective material substantially located in each channel further when the device was being attached to the semiconductor package.

20. The semiconductor package of claim 19, further comprising the channels and further channels formed to substantially correspond with one another, such that the path and corresponding further path form an augmented path.

* * * * *